United States Patent
Parks

(10) Patent No.: US 6,586,784 B1
(45) Date of Patent: Jul. 1, 2003

(54) ACCUMULATION MODE CLOCKING OF A CHARGE-COUPLED DEVICE

(75) Inventor: Christopher Parks, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 10/263,169

(22) Filed: Oct. 2, 2002

(51) Int. Cl.$^7$ ............... H01L 27/148; H01L 29/768
(52) U.S. Cl. ............... 257/236; 257/220; 257/221; 257/246; 257/249; 377/60; 377/61; 377/62; 377/63
(58) Field of Search ............... 257/219, 220, 257/221, 236, 245, 246, 249; 377/57, 58, 59, 60, 61, 62, 63

(56) References Cited

U.S. PATENT DOCUMENTS

| | | | |
|---|---|---|---|
| 4,709,380 A | * 11/1987 | Itoh | 377/58 |
| 4,963,952 A | 10/1990 | Janesick | 357/24 |
| 5,151,380 A | 9/1992 | Hynecek | 437/53 |
| 5,521,405 A | * 5/1996 | Nakashiba | 257/248 |
| 5,796,801 A | * 8/1998 | Nakashiba | 377/60 |
| 5,986,296 A | * 11/1999 | Caranhac et al. | 257/221 |
| 6,426,238 B1 | * 7/2002 | Morimoto | 438/52 |

* cited by examiner

Primary Examiner—Ngân V. Ngô
(74) Attorney, Agent, or Firm—Peyton C. Watkins

(57) ABSTRACT

A method for reducing dark current within a charge coupled device includes the steps of providing three or more phases of gates separated by an insulating layer from a buried channel of the first conductivity type in a well or substrate of the second conductivity type, and a clock driver for causing the transfer of charge through the charge coupled device; providing a barrier for separating charge packets when in accumulation state; applying, at a first time period, voltages to all phases of gates sufficient to cause the surface of the first conductivity type to be accumulated by dark current reducing charge carriers; after the first time period, applying, at each gate phase n having a capacitance $C_n$ to the layer of the second conductivity type, a voltage change on the gate phase n given by $\Delta V_n$ such that the sum of products of the capacitances and voltage changes is substantially zero $$\sum_n C_n \Delta V_n \cong 0;$$

after the voltage changes required to transfer charge through the charge coupled device, returning the voltages of all phases of gates back to the voltage sufficient to cause the surface of the first conductivity type to be accumulated by dark current reducing charge carriers.

2 Claims, 4 Drawing Sheets

ACCUMULATION MODE CLOCKING OF A CHARGE-COUPLED DEVICE

FIELD OF THE INVENTION

The invention relates generally to the field of charge-coupled devices and, more particularly, to such charge-coupled devices having substantially no capacitance when in the accumulation mode.

BACKGROUND OF THE INVENTION

As shown in FIG. 1, prior art charge-coupled devices 10 typically include a substrate or well 20 of the first conductivity type and buried channel 30 of the second conductivity type for the transfer of charge packets 40. A plurality of gates 50 are separated from the buried channel 30 by a thin insulating layer 60. For the purpose of illustration, it is assumed that the first conductivity type is p-type and the second conductivity type is n-type. The charge packets 40 are electrons flowing in the n-type buried channel 30. The opposite type of the electron charge packets 40 will be holes flowing in the p-type substrate or well 20.

Voltages applied to the gates 50 alter the potential energy within the buried channel 30 for the purpose of controlling the transfer of charge packets 40 through the charge-coupled device 10. Additional p-type implants 70 are used to selectively alter the channel potential under the gates 50 for controlling the direction of charge packet 40 transfer.

If the CCD 10 is to be used as an imaging device, then the charge packets 40 transferred through the buried channel 30 were generated by photons. The photo-generated electrons in the charge packets 40 are called photoelectrons. In the case of full frame type image sensors, the photoelectrons are generated directly in the CCD. In the case of interline frame transfer image sensors, the photoelectrons are generated in photodiodes adjacent to the CCD. There are also undesired electrons generated in the charge packets by thermal processes. These thermally generated electrons degrade the charge packet signal quality. It is well known that the thermal generation rate of electrons may be reduced by maintaining the gates 50 at a negative voltage with respect to the well or substrate 20. This causes holes to accumulate at the surface of the buried channel 30. The abundance of holes at the surface suppresses the thermal generation of electrons. Gates 50 biased to maintain holes at the surface are said to be in accumulation. Gates 50 biased such that holes are not present at the surface are said to be in depletion. A description of the benefits of accumulation mode clocking of CCD's may be found in U.S. Pat. No. 4,963,952 by Janesick and in Solid-State Imaging with Charge-Coupled Devices by Albert J. P. Theuwissen.

In FIG. 1, at time T1 all gate 50 voltages are at the low level which accumulates holes at the surface of the buried channel 30. At time T1, the thermal generation of dark current is lowest. To move the charge packets 40, the gates 50 must be clocked. The CCD shown in FIG. 1 is a two phase CCD. It has two sets of gates, the first set 51 is clocked at voltage V1 and the second set 52 is clocked at voltage V2. The clocking sequence of the voltages V1 and V2 are shown in FIG. 1. It is well understood that CCDs may be fabricated with more than two sets of gates.

The gate 50 clocking scheme of U.S. Pat. No. 4,963,952 is sufficient for CCDs built in p-type substrates. The p-type substrate acts as a source or sink of holes as the gates 50 are clocked between accumulation and depletion voltages. However, as shown in FIG. 2 many interline CCD image sensors are built on n-type substrates 100 with p-type wells 20. The well 20 is confined in a narrow layer between the substrate 100 and buried channel 30. Now the well 20 can not easily act as a source or sink of holes. When the gates 50 are clocked into accumulation, the holes must flow long distances from the well contact 110 at the perimeter of the CCD to the center of the CCD. The well 20 has a high resistance to the flow of holes. The nth gate 50 has a capacitance to the well 20 given by $C_n$. The well 20 has a resistance from the well contact 110 to the nth gate given by $R_n$. When the nth gate 50 is clocked into accumulation or depletion, the time it takes for holes to flow from the well contact 110 will be related to the product of $C_n R_n$. For large area CCDs, this time becomes so long that it limits the advantage of accumulation mode clocking.

One solution to this problem is described in U.S. Pat. No. 5,151,380. This patent discloses adding more well contacts 110 with a low resistance metal throughout the entire area of the CCD. While the low resistance metal would certainly speed up the flow of holes in and out of the well 20, it adds significant complexity to the manufacturing process. The additional contacts 110 to the well 20 in close proximity to the CCD also introduces impurities to the buried channel 30 which increases the thermal generation of electrons. The presence of the low resistance metal may also block photons from reaching the photosensitive area of the CCD.

Consequently, it is clear that there is a need for a method of clocking a CCD in accumulation mode that does not require holes to travel long distances. In addition, it is also desirable for the method to apply to CCD's having more than two phases.

SUMMARY OF THE INVENTION

The present invention is directed to overcoming one or more of the problems set forth above. Briefly summarized, according to one aspect of the present invention, the invention resides in A method for reducing dark current within a charge coupled device comprising the steps of: (a) providing three or more phases of gates separated by an insulating layer from a buried channel of the first conductivity type in a well or substrate of the second conductivity type, and a clock driver for causing the transfer of charge through the charge coupled device; (b) providing a barrier for separating charge packets when in accumulation state; (c) applying, at a first time period, voltages to all phases of gates sufficient to cause the surface of the first conductivity type to be accumulated by dark current reducing charge carriers; after the first time period, applying, at each gate phase n having a capacitance $C_n$ to the layer of the second conductivity type, a voltage change on the gate phase n given by $\Delta V_n$ such that the sum of products of the capacitances and voltage changes is substantially zero $$\sum_n C_n \Delta V_n \cong 0;$$

and after the voltage changes required to transfer charge through the charge coupled device, returning the voltages of all phases of gates back to the voltage sufficient to cause the surface of the first conductivity type to be accumulated by dark current reducing charge carriers.

These and other aspects, objects, features and advantages of the present invention will be more clearly understood and appreciated from a review of the following detailed description of the preferred embodiments and appended claims, and by reference to the accompanying drawings.

Advantageous Effect Of The Invention

The present invention has the advantage of reducing dark current, particularly in a three or more phase device, by enabling holes to flow more freely in accumulation without the need for additional contacts, which are undesirable as described hereinabove.

DETAILED DESCRIPTION OF THE INVENTION

Figure 3:
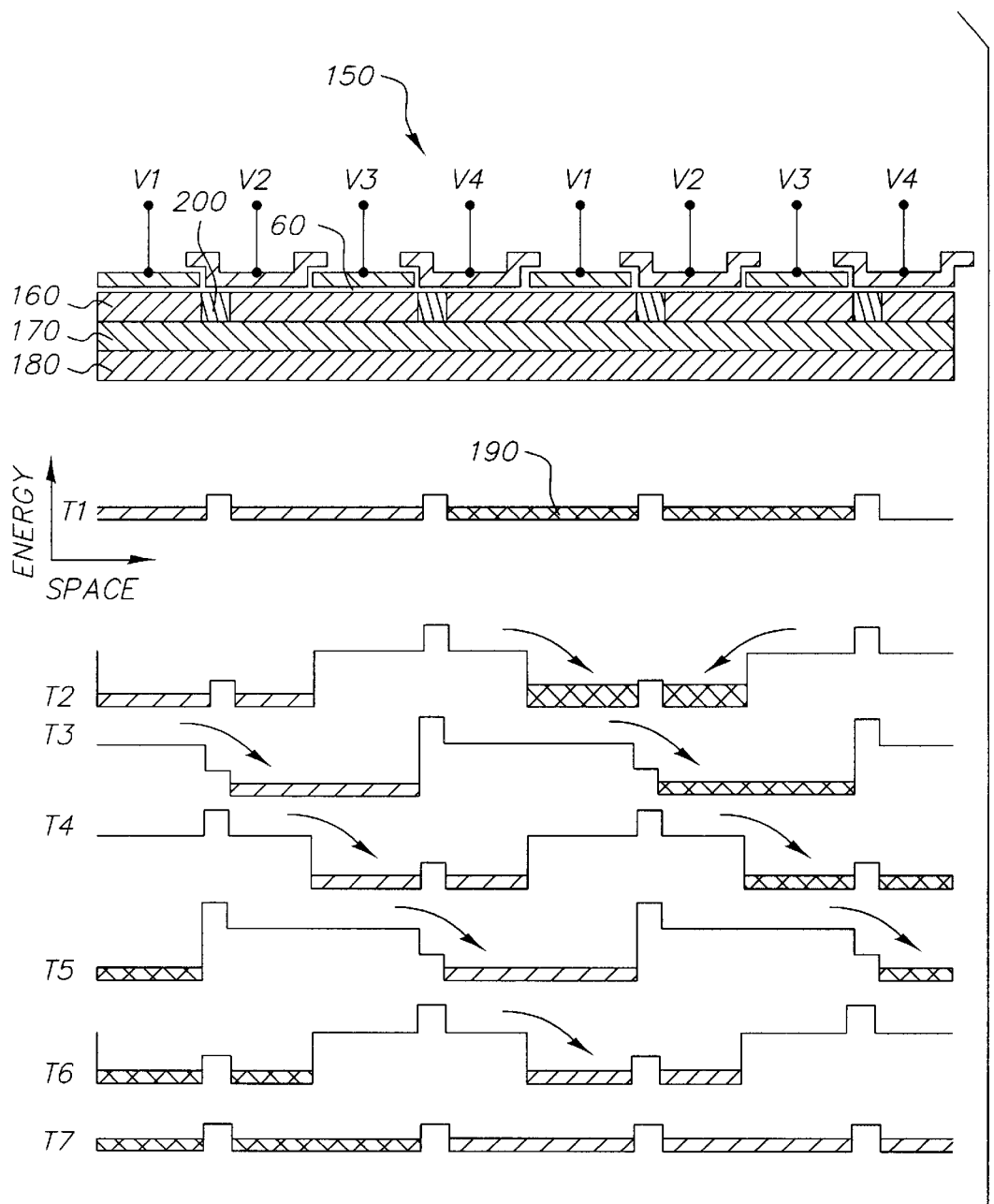
FIG. 3 is a side view in vertical cross section of a CCD of the present invention and its associated transfer diagrams.

Referring to FIG. 3, there is shown a four phase CCD 150 of the present invention. A four phase CCD is selected for exemplary purposes of a preferred embodiment. It will be readily apparent to those skilled in the art that the invention will apply to any CCD having three or more phases. The CCD 150 has four sets of gates identified as V1, V2, V3, and V4. The CCD 150 also includes an n-type buried channel 160 in a p-type well 170 on an n-type substrate 180. Charge packets of electrons 190 are confined within the buried channel 160. P-type implants 200 are selectively placed under predetermined gates in order to keep the charge packets 200 separated when all the gates are in accumulation.

The present invention includes a means of clocking the CCD gates without the requirement of holes flowing through the p-well 170. It is instructive to note that $C_n$ is designated as the capacitance of CCD gate phase n to the p-well 170. At any given time, $\Delta V_n$ is designated as the change in voltage of CCD gate phase n, and $\Delta Q_n$ is designated as the amount of charge represented by the holes under CCD gate phase n which must flow into or out of the p-well 170 when the gate voltage is changed by $\Delta V_n$. When $\Delta V_n$ is positive, hole charge must flow away from the buried channel 160 surface into the p-well 170. When $\Delta V_n$ is negative, hole charge must flow from the p-well 170 to the buried channel surface 160. The amount of the charge under phase n given by the equation $$\Delta Q_n = C_n \Delta V_n.$$

The present invention includes a clocking scheme such that the total net flow of holes in or out of the p-well 170 is always near zero. This statement is given as $$\sum_n \Delta Q_n = \sum_n C_n \Delta V_n \cong 0.$$

Figure 4:
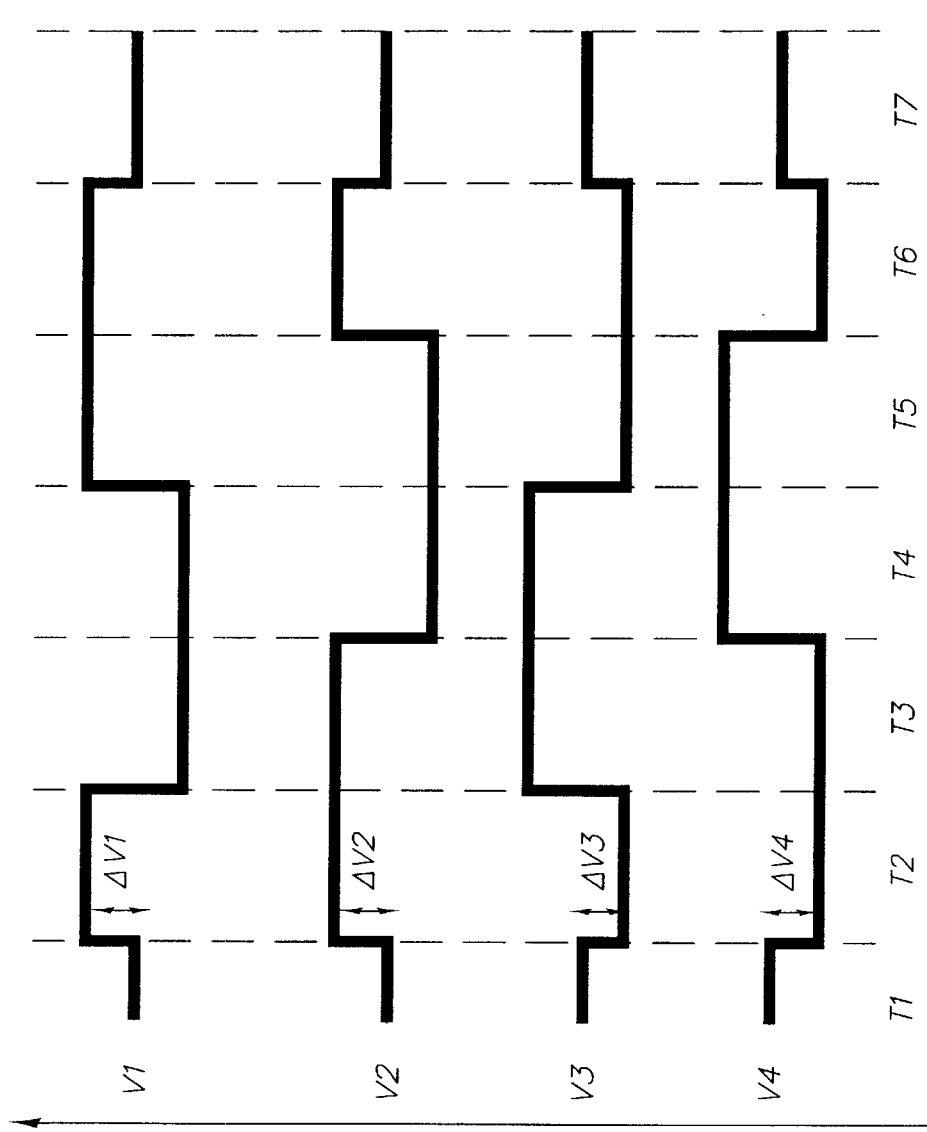
FIG. 4 is a diagram of the clocking for the CCD of FIG. 3.

Continuing with the four phase example of FIG. 4, the timing of the four gates is shown in FIG. 4. If the time interval from time T1 to time T2 is examined, it is readily apparent that V1 and V2 have a positive transition. At the same time, V3 and V4 have an equal but opposite negative transition. This is true for each time interval. Every positive going clock edge on one phase is compensated by a negative going edge on one or more other phases. By utilizing compensated clock edges there is no net flow of holes through the p-well 170. With no need to wait for holes to flow through the p-well 170, the CCD gate phases may be clocked more rapidly and returned back to their accumulated state. The present invention keeps the CCD gate phases in the accumulated state for a longer period of time than in the prior art. The accumulated state lowers the thermal generation rate of unwanted electrons. The present invention also applies to CCD image sensor types of full frame, frame transfer, interline transfer, and frame interline transfer, and as stated above, it also applies to CCD types having three or more phases.

Figure 1:
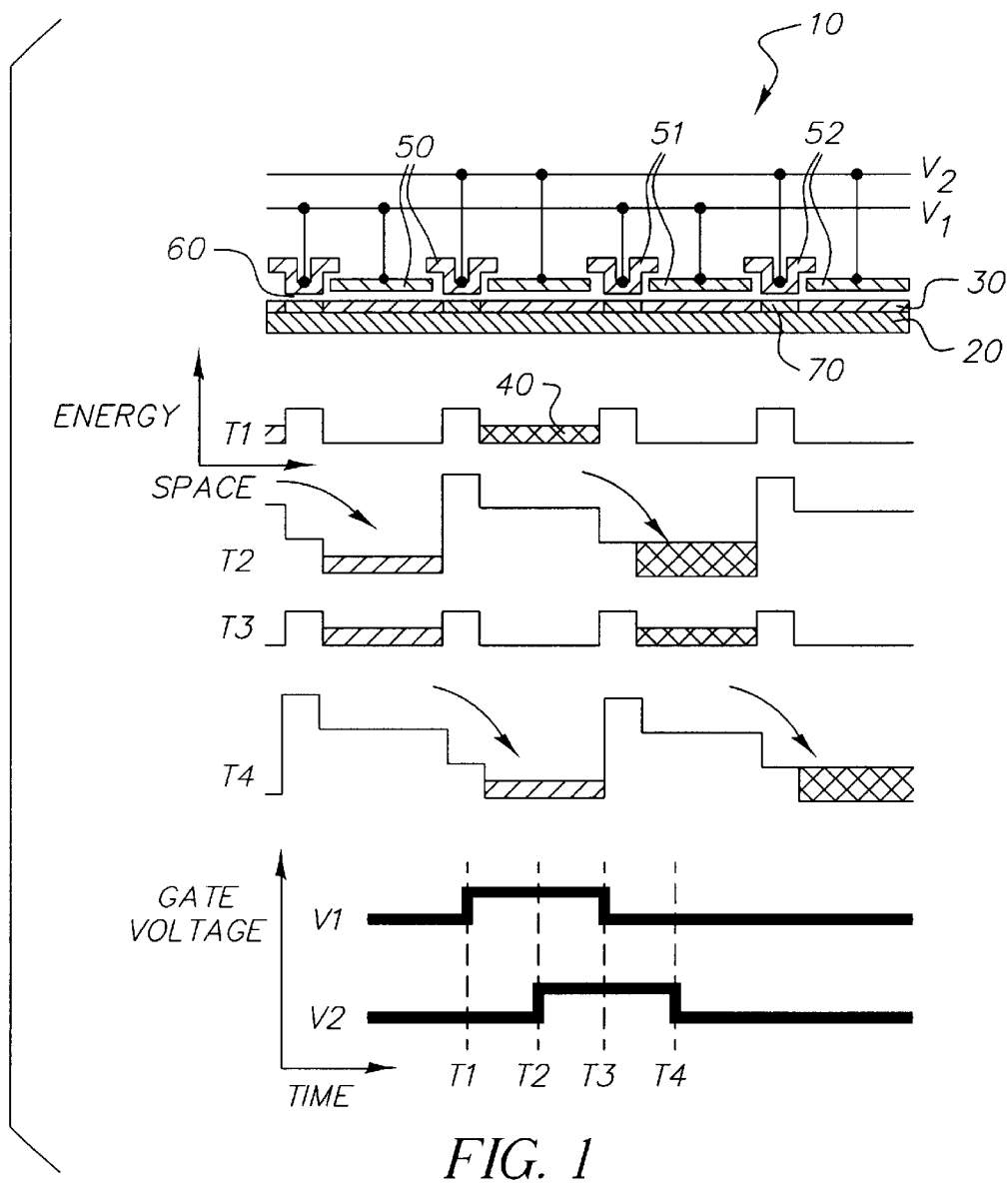
FIG. 1 is a side view in vertical cross section of a prior art CCD and its associated clocking and energy transfer diagrams.
Figure 2:
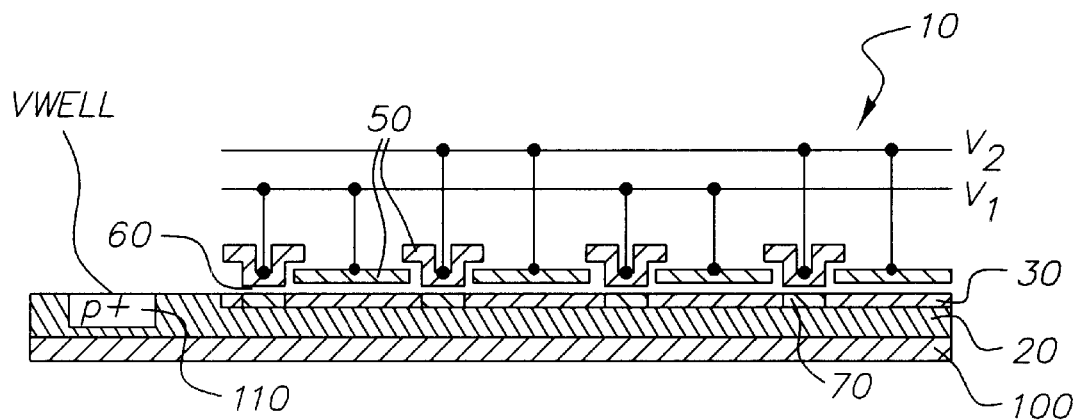
FIG. 2 is a side view in vertical cross section of another prior art CCD.
Figure 5:
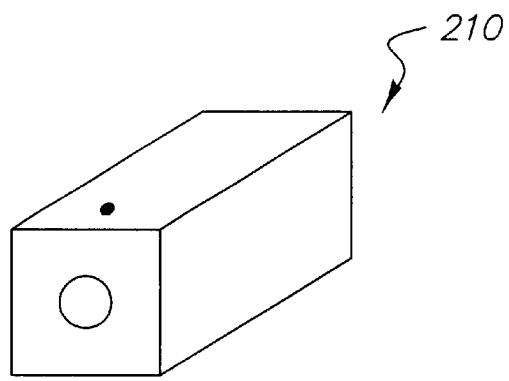
FIG. 5 is a perspective view of a digital camera for implementing a typical commercial embodiment of the present invention.

Referring to FIG. 5, there is shown a digital camera 210 in which the CCD 150 may be inserted for implementing a commercial embodiment of the present invention. Although a digital camera is shown, other image capture devices such as satellite imaging, video imaging and the like may implement the present invention.

The invention has been described with reference to a preferred embodiment. However, it will be appreciated that variations and modifications can be effected by a person of ordinary skill in the art without departing from the scope of the invention.

| PARTS LIST | |
|---|---|
| 10 | CCD |
| 20 | substrate or well |
| 30 | buried channel |
| 40 | charge packets |
| 50 | gates |
| 51 | first set of gates |
| 52 | second set of gates |
| 60 | insulating layer |
| 70 | p-type implants |
| 100 | substrate |
| 110 | contract |
| 150 | CCD |
| 160 | buried channel |
| 170 | p-type well |
| 180 | substrate |
| 200 | p-type implants |
| 210 | camera |

What is claimed is:

1. A method for reducing dark current within a charge coupled device, the method comprising the steps of:

providing three or more phases of gates separated by an insulating layer from a buried channel of the first conductivity type in a well or substrate of the second conductivity type, and a clock driver for causing the transfer of charge through the charge coupled device;

providing a barrier for separating charge packets when in accumulation state;

applying, at a first time period, voltages to all phases of gates sufficient to cause the surface of the first conductivity type to be accumulated by dark current reducing charge carriers;

after the first time period, applying, at each gate phase n having a capacitance $C_n$ to the well or substrate of the second conductivity type, a voltage change on the gate phase n given by $\Delta V_n$ such that the sum of products of the capacitances and voltage changes is substantially zero $$\sum_n C_n \Delta V_n \cong 0;$$

after the voltage changes required to transfer charge through the charge coupled device, returning the voltages of all phases of gates back to the voltage sufficient to cause the surface of the first conductivity type to be accumulated by dark current reducing charge carriers.

2. A camera comprising:

(a) a charge coupled device which reduces dark current within the charge-coupled device;

the charge coupled device comprising:

(b) three or more phases of gates separated by an insulating layer from a buried channel of the first conductivity type in a well or substrate of the second conductivity type, and a clock driver for causing the transfer of charge through the charge coupled device;

(c) a barrier for separating charge packets when in accumulation state;

wherein at a first time period, voltages to all phases of the gates are sufficient to cause the surface of the first conductivity type to be accumulated by dark current reducing charge carriers;

wherein after the first time period, at each gate phase n having a capacitance $C_n$ to the well or substrate of the second conductivity type, a voltage change on the gate phase n given by $\Delta V_n$ is such that the sum of products of the capacitances and voltage changes is substantially zero $$\sum_n C_n \Delta V_n \cong 0;$$

and wherein after the voltage changes required to transfer charge through the charge coupled device, the voltages of all phases of gates returns back to the voltage sufficient to cause the surface of the first conductivity type to be accumulated by dark current reducing charge carriers.

* * * * *